US006479210B2

(12) United States Patent
Kinoshita et al.

(10) Patent No.: US 6,479,210 B2
(45) Date of Patent: Nov. 12, 2002

(54) CHEMICALLY AMPLIFIED RESIST COMPOSITION

(75) Inventors: Yoshiaki Kinoshita, Shizuoka (JP); Satoru Funato, Shizuoka (JP); Yuko Yamaguchi, Isehara (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/445,345

(22) PCT Filed: Apr. 5, 1999

(86) PCT No.: PCT/JP99/01791

§ 371 (c)(1),
(2), (4) Date: Apr. 3, 2000

(87) PCT Pub. No.: WO99/53377

PCT Pub. Date: Oct. 21, 1999

(65) Prior Publication Data

US 2001/0036589 A1 Nov. 1, 2001

(30) Foreign Application Priority Data

Apr. 8, 1998 (JP) .............................................. 10-95680

(51) Int. Cl.$^7$ ................................................ G03F 7/004
(52) U.S. Cl. .................... 430/270.1; 430/914; 430/919; 430/921
(58) Field of Search .............................. 430/270.1, 914, 430/921, 919

(56) References Cited

U.S. PATENT DOCUMENTS

| 5,216,135 | A |   | 6/1993  | Urano et al.     | 534/556   |
|-----------|---|---|---------|------------------|-----------|
| 5,332,648 | A |   | 7/1994  | Kihara et al.    | 430/270   |
| 5,350,660 | A |   | 9/1994  | Urano et al.     | 430/176   |
| 5,468,589 | A |   | 11/1995 | Urano et al.     | 430/170   |
| 5,525,453 | A | * | 6/1996  | Przybilla et al. | 460/170   |
| 5,558,971 | A |   | 9/1996  | Urano et al.     | 430/170   |
| 5,558,976 | A |   | 9/1996  | Urano et al.     | 430/326   |
| 5,609,989 | A | * | 3/1997  | Bantu et al.     | 430/270.1 |
| 5,624,787 | A |   | 4/1997  | Watanabe et al.  | 430/270.1 |
| 5,981,140 | A | * | 11/1999 | Sato et al.      | 430/270.1 |
| 6,187,504 | B1| * | 2/2001  | Suwa et al.      | 430/270.1 |
| 6,200,728 | B1| * | 3/2001  | Cameron et al.   | 430/270.1 |
| 6,280,911 | B1| * | 8/2001  | Trefonas, III    | 430/326   |

FOREIGN PATENT DOCUMENTS

| EP | 0 440 374    | 8/1991 |
| EP | 0 440 375    | 8/1991 |
| EP | 0 558 280    | 9/1993 |
| EP | 0 831 369    | 3/1998 |
| EP | 0 985 974 A1 | 3/2000 |

OTHER PUBLICATIONS

Abstract from Japanese Patent Application No. JP5127369.

* cited by examiner

*Primary Examiner*—Rosemary Ashton
(74) *Attorney, Agent, or Firm*—Sangya Jain

(57) ABSTRACT

A chemically amplified resist composition is disclosed which shows a high sensitivity, high resolution, excellent processing adaptability and excellent processing stability, which can form good pattern profile and which is suited as a finely processable material for use in manufacturing integrated circuit elements or the like. The chemically amplified resist composition comprises at least (a) an organic material containing a substituent or substituents capable of being released in the presence of an acid and (b) compounds capable of generating an acid upon exposure to radiation (acid-generators), composed of at least one onium salt and at least one of sulfone compounds and sulfonate compounds. This chemically amplified resist composition preferably further contains a basic compound.

5 Claims, No Drawings

CHEMICALLY AMPLIFIED RESIST COMPOSITION

TECHNICAL FIELD

This invention relates to a chemically amplified resist composition for use in manufacturing integrated circuit elements or the like. More particularly, it relates to a chemically amplified resist composition which is sensitive to radiation such as UV rays, deep UV rays, electron beams, X-rays or the like and which can give a good pattern profile with high sensitivity and high resolution.

BACKGROUND ART

In the art of fine processing technology such as manufacture of integrated circuit elements, radiation sensitive resist materials showing high resolution have been desired as the degree of integration is increasing. In recent years, a pattern rule of the order of sub-quarter micron has been demanded. In order to comply with the demand, exposure equipment for use in fine processing, particularly photolithography, are being equipped with a light source emitting light of an increasingly shorter wavelength. Namely, the light sources have been changed from g-line (436 nm) and i-line (365 nm) to KrF excimer laser (246 nm in deep UV region) and ArF excimer laser (193 nm also in deep UV region). As radiation sensitive resist materials suited for forming patterned resists by exposing with such short wavelength light, there have been developed chemically amplified resists which can create images with less amount of light absorption and which show high sensitivity, and various such resists have been reported. The chemically amplified resists are resists which give a pattern through the phenomenon that acids are generated upon exposure, and the acids in turn cause chemical reaction (e.g., change in polarity, cleavage of chemical bond, cross-linking reaction, etc.) based on their catalytic activity in the resist coating to cause change in solubility of the radiation-exposed areas for an alkaline developer solution. As such chemically amplified resist materials, there are known, for example, those chemically amplified resist materials which are reported by Ito et al. and which comprise a hydroxystyrene polymer wherein part of phenolic hydroxyl groups are protected by t-butyloxycarbonyl (t-BOC) group and a compound which generates an acid such as triphenylsulfonium hexafluoroantimonate [H. I to and C. G. Wilson, Polym. Eng. Sci., vol.23, 1012(1983)]. In the resist materials, acids are generated in exposed areas by exposure, and the acids function, after exposure, to catalytically eliminate and release t-butoxycarbonyl (t-BOC) group upon baking at a temperature of, for example, above 50° C. (post exposure baking; PEB), thus producing hydroxystyrene capable of being soluble in an alkaline developer solution. If acids are generated even in a slight amount during exposure, several t-butyloxycarbonyl groups can be eliminated by the catalytic chain reaction. This elimination or releasing reaction proceeds catalytically, and hence the chemically amplified resist materials can show high sensitivity when exposed to deep UV rays. With respect to the chemically amplified resist materials, various protective groups known in the field of organic synthesis have been tried and reported for obtaining positive-working deep UV ray photoresists, following the t-butyloxycarbonyl group reported by Ito et al.

As at present known positive-working resist compositions, there are those which contain (a) an alkali-insoluble or slightly alkali-soluble resin which is protected by the group capable of being eliminated and released by acid (hereinafter referred to as "acid-decomposable group") and which becomes alkali-soluble when the acid-decomposable group is released (hereinafter referred to as "resin containing acid-decomposable groups") and (b) a compound capable of generating acid upon exposure with radiation (hereinafter referred to as "acid-generator") and, optionally, an auxiliary component (c) a compound which controls alkali solubility of the resin (a) containing acid-decomposable groups and which is decomposed in the presence of an acid to undergo reduction or loss of the effect of controlling alkali solubility of the resin containing acid-decomposable groups (hereinafter referred to as "dissolution inhibitor").

As the acid-generator for the chemically amplified resist composition, there are known onium salt compounds, sulfone compounds, sulfonate compounds, etc. Onium salt compounds have such a strong ability of suppressing dissolution of resist coating that unexposed portions of the radiation sensitive material show a smaller dissolution property for a developer solution, though they generates a comparatively strong acid upon being exposed. Therefore, the chemically amplified resist containing an onium salt compound can provide resist pattern with high resolution. On the other hand, it has defects that it is liable to form standing waves on a developed resist pattern and, under some process atmosphere, generate an insoluble layer on the surface of the resist layer which forms an overhung profile, called T-top. Further, the onium salt compound has the defect that it has such a poor solubility in resist solvents that its amount of addition to a resist is limited. On the other hand, sulfone compounds and sulfonate compounds show a high solubility in resist solvents and less ability of suppressing dissolution of resist coating into a developer solution, but solubility of decomposition products thereof after exposure is better than that of the onium salt compounds. Hence, in comparison with the onium salt compounds, the sulfone compounds and the sulfonate compounds enable one to increase contrast and form less standing waves on developed resist patterns. In addition, since they generate comparatively weak acids, they are advantageous from the point of view of environmental pollution, too. However, they have the defect that they provide a large dimensional difference between line width in a dense pattern area and that in an isolated pattern area due to their high solubility.

As is described above, various chemically amplified resist compositions are known as resist materials sensitive to UV rays, deep UV rays, electron beams, X-rays or the like, and various acid-generators for use in them are also known. However, all of the acid-generators have some defects and do not show satisfactory result.

An object of the present invention is to provide a method of forming a pattern not having the above-described defects.

That is, an object of the present invention is to provide a chemically amplified resist composition which shows a high sensitivity and a high resolution, which shows excellent process adaptability and process stability, which has no dependence on processing conditions and which can form a resist image with good pattern profile.

DISCLOSURE OF THE INVENTION

As a result of intensive investigations, the inventors have found that a positive-working chemically amplified resist composition which can satisfy the above-described requirements can be obtained by using, as the acid-generators, at least one onium salt compound in combination with at least one of the sulfone compounds and the sulfonate compounds and, optionally, a specific basic compound, thus having completed the present invention based on the findings.

That is, the subject of the present invention is a chemically amplified resist composition which contains an organic material having a substituent or substituents capable of being released in the presence of an acid and a compound capable of generating an acid upon exposure with radiation (acid-generator) and which undergoes change in solubility for an alkaline developer solution in radiation-exposed areas thereof due to the catalytic action of the acid generated by exposure with radiation to form a pattern, said compound capable of generating an acid by exposure with radiation comprising both at least one onium salt compounds and at least one of sulfone compounds and/or sulfonate compounds.

In addition, the subject of the present invention is the chemically amplified resin composition as described above, which further contains at least one of basic compounds selected from among sulfonium compounds, iodonium compounds and ammonium compounds.

Thus, the present invention includes three embodiments, i.e., an embodiment containing as the acid-generators at least one onium salt compound and at least one sulfone compound; an embodiment containing at least one onium salt compound and at least one sulfonate compound; and an embodiment containing at least one onium salt compound, at least one sulfone compound and at least one sulfonate compound. As the onium salt compound, sulfone compound and sulfonate compound, any one that functions as an acid-generator may be used.

The chemically amplified resist composition of the present invention contains the specific acid-generators as described above, but it may further contain optional additives, particularly preferably a basic compound and a solvent. In the present invention, the organic material having a substituent or substituents capable of being released in the presence of an acid is preferably the resin containing acid-decomposable groups described above, which is used in combination with the above-described acid-generators and optionally the auxiliary dissolution inhibitors.

These components constituting the resist composition will be described in more detail below.

Resin Containing Acid-decomposable Groups

The resins containing acid-decomposable groups to be used in the present invention are those resins which are made alkali-insoluble or slightly alkali-soluble by adding substituents capable of being released in the presence of an acid (acid-decomposable groups) to alkali-soluble polymers containing functional groups showing affinity for an alkali developer solution such as a phenolic hydroxyl group, a carboxyl group, etc.

As examples of alkali-soluble polymer, there are illustrated vinyl polymers having the recurring unit shown by the following formula 1 or 2, phenol resins such as novolak resin, and the like.

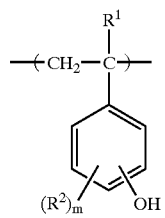
(1)

Wherein $R^1$ represents a hydrogen atom or an alkyl group, $R^2$ represents an alkyl group, and m is 0 or an integer of 1 to 4.

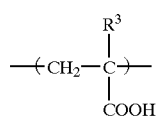
(2)

Wherein $R^3$ represents a hydrogen atom or an alkyl group.

Examples of the polymers containing the recurring unit represented by the formula 1 above include poly(hydroxystyrene), poly(hydroxy-α-methylstyrene), poly(hydroxymethylstyrene), etc. and examples of the polymers containing the recurring unit represented by the formula 2 above include homopolymers or copolymers of acrylic or methacrylic acid.

On the other hand, examples of compounds to be used for adding the acid-decomposable group include vinyl ether compounds and dialkyl carbonates.

Examples of vinyl ether compounds include, for example, a compound which is represented by formula 3:

$$C(R^4)(R^5)=C(R^6)-O-R^7 \quad (3)$$

wherein $R^4$, $R^5$ and $R^6$ each independently represents a hydrogen atom or a straight, branched, cyclic or hetero atom-containing cyclic alkyl group having 1 to 6 carbon atoms, and $R^7$ represents a straight, branched, cyclic or hetero atom-containing cyclic alkyl group having 1 to 10 carbon atoms or an aralkyl group which may optionally be substituted by a halogen atom, an alkoxyl group, an aralkyloxycarbonyl group or an alkylcarbonylamino group.

Examples of the compounds represented by the formula 3 include isopropenyl methyl ether, 3,4-dihydro-2H-pyrane, butanediol-1,4-divinyl ether, ethylene glycol divinyl ether, triethylene glycol divinyl ether, etc.

Specific examples of the dialkyl carbonate include di-tert-butyl carbonate, etc. The alkali-soluble polymers and the acid-decomposable groups each may be used independently or as a combination of two or more.

Dissolution Inhibitor

Dissolution inhibitors are those substances which themselves contain an acid-decomposable protective group, control the dissolution property of the resin containing acid-decomposable groups for an alkali developer solution and, after being decomposed in the presence of an acid, accelerate dissolution of the resin containing acid-decomposable groups which are also decomposed to render the resin alkali-soluble. Typical examples thereof include dibutoxycarbonylbisphenol A, dibutoxycarbonylbisphenol F, 4-t-butoxycarbonylphenyl, t-butyl cholate, t-butyl deoxycholate, and diphenolic acid tert-butyl ester derivative represented by the following formula 4, or the compound represented by the following formula 5.

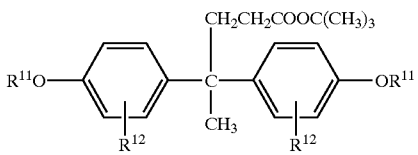

(4)

Wherein $R^{11}$ represents a protective group capable of being easily eliminated under acidic conditions, and $R^{12}$ represent a hydrogen atom, a lower alkyl group or an alkoxyl group.

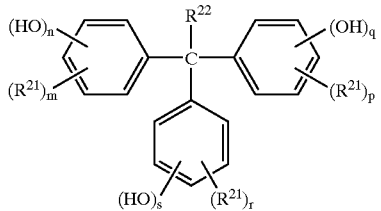

(5)

Wherein $R^{21}$ represents a hydrogen atom, an alkyl group having 4 or less carbon atoms, a phenyl group, a naphthyl group or $-(CH_2)_x-COOZ$ group and, when two or more $R^{21}$ exist, $R^{21}$'s may be the same or different from each other, Z represents an alkoxyalkyl group, a cyclic ether group, a vinyloxyalkyl group or a t-alkoxycarbonylalkyl group and, when two or more Z exist, Z's may be the same or different from each other, x is an integer of 0 to 4, $R^{22}$ represents a hydrogen atom, an alkyl group having 6 or less carbon atoms, an acyl group having 6 or less carbon atoms, a phenyl group, a naphthyl group or $-(CH_2)_x-COOZ$ group(wherein x and Z are the same as defined above), m, n, p, q, r and s are integers of 0 or more with $m+n \leq 5$, $p+q \leq 5$, $r+s \leq 5$ and $n+q+s \geq 1$.

Typical examples of the compounds represented by the above formula 4 or 5 include bis(4-t-butoxycarbonylmethyloxy-2,5-dimethylphenyl)methyl-4-t-butoxycarbonylmethyloxybenzene, etc.

As to the proportion of the resin containing acid-decomposable groups to the dissolution inhibitor, 5 to 40 parts by weight of the dissolution inhibitor is preferably used per 10 parts by weight of the resin containing acid-decomposable groups.

Acid Generator (Onium Salt Compounds)

As the onium salt compounds to be used in the present invention as acid generators, any of those which are known to generate an acid upon exposure may be used. For example, there are illustrated sulfonium salt compounds, iodonium salt compounds, phosphonium salt compounds, diazonium salt compounds, pyridinium salt compounds, etc. Of these onium salt compounds, sulfonium salt compounds and iodonium salt compounds are preferred, with sulfonium salt compounds being particularly preferred.

Examples of the sulfonium salt compounds and the iodonium compounds to be used in the present invention are illustrated below.

(i) Sulfonium Salt Compounds

Triphenylsulfonium methanesulfonate, triphenylsulfonium trifluoromethanesulfonate, triphenylsulfonium propionate, triphenylsulfonium hexafluoropropanesulfonate, triphenylsulfonium nonafluorobutanesulfonate, triphenylsulfonium phenylsulfonate, triphenylsulfonium 4-methylphenylsulfonate, triphenylsulfonium 4-methoxyphenylsulfonate, triphenylsulfonium p-chlorophenylsulfonate, triphenylsulfonium camphorsulfonate, 4-methylphenyl-diphenylsulfonium trifluoromethanesulfonate, bis(4-methylphenyl)-phenylsulfonium trifluoromethanesulfonate, tris-4-methylphenylsulfonium trifluoromethanesulfonate, 4-t-butylphenyl-diphenylsulfonium trifluoromethanesulfonate, 4-methoxyphenyl-diphenylsulfonium trifluoromethanesulfonate, mesityl-diphenylsulfonium trifluoromethanesulfonate, 4-chlorophenyl-diphenylsulfonium trifluoromethanesulfonate, bis-(4-chlorophenyl)-phenylsulfonium trifluoromethane-sulfonate, tris-(4-chlorophenyl)sulfonium trifluoromethane-sulfonate, 4-methylphenyl-diphenylsulfonium hexafluoropropanesulfonate, bis(4-methylphenyl)-phenylsulfonium hexafluoropropanesulfonate, tris-4-methylphenylsulfonium hexafluoropropanesulfonate, 4-t-butylphenyl-diphenylsulfonium hexafluoropropanesulfonate, 4-methoxyphenyl-diphenylsulfonium hexafluoropropane-sulfonate, mesityl-diphenylsulfonium hexafluoropropane-sulfonate, 4-chlorophenyl-diphenylsulfonium hexafluoropropanesulfonate, bis-(4-chlorophenyl)-phenylsulfonium hexafluoropropanesulfonate, tris-(4-chlorophenyl)sulfonium hexafluoropropanesulfonate, triphenylsulfonium naphthalenesulfonate, etc.

(ii) Iodonium Salt Compounds

Diphenyliodonium trifluoromethanesulfonate, diphenyliodonium hexafluoropropanesulfonate, diphenyliodonium p-4-methylphenylsulfonate, bis-(p-t-butylphenyl)iodonium trifluoromethanesulfonate, bis-(p-t-butylphenyl)iodonium hexafluoropropanesulfonate, bis-(p-cyclohexylphenyl) iodonium trifluoromethanesulfonate, bis-(p-cyclohexylphenyl)iodonium hexafluoropropanesulfonate, diphenyliodonium pyrenesulfonate, diphenyliodonium dodecylbenzenesulfonate, etc.

Of the above-described sulfonium compounds and the iodonium compounds, triphenylsulfonium trifurate, triphenylsulfonium propionate, triphenylsulfonium hexafurate and diphenyliodonium trifurate are particularly preferable.

(Sulfone Compounds)

As the sulfone compounds, there are illustrated, for example, β-ketosulfones, β-sulfonylsulfones and α-diazo compounds thereof. Specific examples of these sulfone compounds are given below:

(i) bissulfonylmethanes such as methylsulfonyl p-toluenesulfonylmethane, bis(phenylsulfonyl)methane, bis(4-methylphenylsulfonyl)methane, bis(3-methylphenylsulfonyl)methane, bis(4-ethylphenylsulfonyl)methane, bis(2,4-dimethylphenylsulfonyl)methane, bis(4-t-butylphenylsulfonyl)methane, bis(4-methoxyphenylsulfonyl)-methane, bis(4-fluorophenylsulfonyl)methane, bis(4-chlorophenylsulfonyl)methane, bis(4-bromophenylsulfonyl)-methane, biscyclohexylsulfonylmethane, etc.;

(ii) bissulfonyldiazomethanes such as bis(isopropylsulfonyl) diazomethane, bis(t-butylsulfonyl)diazomethane, bis(sec-butylsulfonyl)diazomethane, bis(cyclopentylsulfonyl) diazomethane, bis(cyclohexylsulfonyl)diazomethane, cyclohexylsulfonylethylsulfonyldiazomethane, cyclohexyl-sulfonyl t-butylsulfonyldiazomethane, methylsulfonyl p-toluenesulfonyldiazomethane, bis (phenylsulfonyl)diazomethane, bis(4-methylphenylsulfonyl)diazomethane, bis(3-methylphenylsulfonyl)diazomethane, bis(4- ethylphenylsulfonyl)diazomethane, bis(2,4-dimethylphenyl-sulfonyl)diazomethane, bis(4-t-butylphenylsulfonyl)-diazomethane, bis(4-methoxyphenylsulfonyl)diazomethane, bis(4-fluorophenylsulfonyl)diazomethane, bis(4-chlorophenylsulfonyl)diazomethane, bis(4-bromophenylsulfonyl)diazomethane, etc.;

(iii) sulfonylcarbonyldiazomethanes such as cyclohexylsulfonylcyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethylbutanone, 1-acetyl-1-(1-methylethylsulfonyl)diazomethane, 1-diazo-1-methylsulfonyl-4-phenyl-2-butanone, p-toluenesulfonylcyclohexylcarbonyl-diazomethane, 1-diazo-1-(4-methylphenylsulfonyl)-3,3-dimethyl-2-butanone, phenylsulfonylphenylcarbonyl-diazomethane, 1-diazo-1-phenylsulfonyl-3,3-dimethyl-2-butanone, 1-diazo-4-methylphenylsulfonyl)-3-methyl-2-butanone, 2-diazo-2-(4-methylphenylsulfonyl)cyclohexyl acetate, 2-diazo-2-phenylsulfonyl t-butyl acetate, 2-diazo-2-methylsulfonyl isopropyl acetate, 2-diazo-2-phenylsulfonyl t-butyl acetate, 2-diazo-2-(4-methylphenylsulfonyl) t-butyl acetate, etc.; and (iv) sulfonylcarbonylalkanes such as 2-methyl-2-(4-methylphenylsulfonyl)propiophenone, 2-cyclohexylcarbonyl-2-(4-methylphenylsulfonyl) propane, 2-methanesulfonyl-2-methyl-4-methylthiopropiophenone, 2,4-dimethyl-2-(4-methylphenylsulfonyl)pentan-3-one, etc.

Of these illustrative compounds, particularly preferred compounds are biscyclohexylsulfonyldiazomethane, bisphenylsulfonyldiazomethane, biscyclohexylsulfonylmethane, bisphenylsulfonylmethane, etc.

(Sulfonate Compounds)

As the sulfonate compounds, there are illustrated alkylsulfonates, haloalkylsulfonates, arylsulfonates, iminosulfonates, etc. Examples of the sulfonate compounds are:

(i) nitrobenzyl sulfonates such as 2-nitrobenzyl p-toluenesulfonate, 2,4-dinitrobenzyl p-toluenesulfonate, 2,6-dinitrobenzyl p-toluenesulfonate, 2,6-dinitrobenzyl p-trifluoromethylphenylsulfonate, etc;

(ii) alkyl- or arylsulfonates such as pyrogallol trismethanesulfonate, pyrogallol tristrifluoromethanesulfonate, pyrogallol trisphenylsulfonate, pyrogallol tris-4-methylphenylsulfonate, pyrogallol tris-4-methoxyphenylsulfonate, pyrogallol tris-2,4,6-trimethylphenylsulfonate, pyrogallol trisbenzyl sulfonate, similar compounds derived from gallic acid esters, catechol, resorcinol or hydroquinone;

(iii) benzoin sulfonates such as benzoin tosylate, benzoin mesylate, etc.; and (iv) sulfonic acid esters such as 2,2,2-trifluoro-1-trifluoromethyl-1-(3-vinylphenyl)-ethyl 4-chlorobenzenesulfonate, 2,2,2-trifluoro-1-p-tolyl-1-trifluoromethylethyl 4-chlorobenzenesulfonate, 2,2,2-trifluoro-1-p-tolyl-1-trifluoromethylethyl 4-(2-phenoxyethoxy)-benzenesulfonate, 2,2,2-trifluoro-1-trifluoromethyl-1-(4-vinylphenyl)ethyl-naphthalene-2-sulfonate, 2,2,2-trifluoro-1-phenyl-1-trifluoromethylethyl propanesulfonate, 2,2,2-trifluoro-1-trifluoromethyl-1-(3-vinylphenyl)-ethyl 4-butoxybenzenesulfonate, 2,2,2-trifluoro-1,1-p-tolyl-1-trifluoromethylethyl 3,5-dichlorobenzenesulfonate, 1,3-bis-(2,2,2-trifluoro-1-methanesulfonyloxy-1-trifluoromethyl-ethyl)benzene, 1,4-bis-(2,2,2-trifluoro-1-methanesulfonyloxy-1-trifluoromethylethyl)benzene, etc.

(v) N-sulfonyloxyimides such as N-camphorsulfonyloxynaphthalimide, N-trifluoromethanesulfonyloxynaphthalimide and trifluoromethylsulfonyl bicyclo-(2,2,1)-hept-5-ene-2,3-carboxyimide, etc.

Of these illustrative compounds, pyrogallol tristrifurate, benzoin tosylate, etc. are particularly preferred.

Contents of the above-described onium salt compounds, sulfone compounds and sulfonate compounds in the chemically amplified resist material may be any amounts as long as the objects of the present invention can be attained. In general, however, the onium salt compounds, the sulfone compounds and the sulfonate compounds are used in amounts of 0.5 to 10 parts by weight, 1 to 10 parts by weight and 1 to 10 parts by weight, respectively, based on 100 parts by weight of the organic materials contained in the chemically amplified resist material and having a substituent or substituents capable of being released in the presence of an acid. Mixing ratio of the onium salt compound and the sulfone compound and/or the sulfonate compound is such that 0.1 to 5 parts by weight of the onium salt compound and 0.5 to 10 parts by weight of sum of the sulfone compound and the sulfonate compound are preferably used based on 100 parts by weight of the organic materials having a substituent or substituents capable of being released in the presence of an acid, with 0.5 to 2 parts by weight of the onium salt compound being more preferable. As to a more preferable range of the amounts of the sulfone compound and the sulfonate compound, sulfone compounds and sulfonate compounds capable of generating an acid with high efficiency are used in amounts of 0.5 to 5 parts by weight, and those generating an acid only with poor efficiency are used in amounts of 3 to 10 parts by weight. Additionally, in the case of using only the sulfone compound or the sulfonate compound, said "sum of the two" clearly means the amount of the one compound. If the content of the onium salt compound is less than 0.1 part by weight, the combined use of the onium salt compound and the sulfone compound and/or the sulfonate compound fails to provide sufficient effects—for example, dimensional difference between line width in an isolated pattern area and that in a dense pattern area becomes great. On the other hand, if the content of the onium salt compound exceeds 5 parts by weight, almost no effects of the combined use are obtained—for example, cross section of the formed pattern gives a T-top profile and becomes taper-like, or when some effects of the combined use are obtained, there result other defects such as formation of scum upon development. If the content of the sulfone compound and the sulfonate compound is less than 0.5 part by weight, almost no effects are obtained by the combined use with the onium salt compound—for example, serious standing wave is formed. On the other hand, if the content exceeds 10 parts by weight, there result such defects as that dimensional difference between line width in an isolated pattern area and that in a dense pattern area becomes great, and that cross section of the formed pattern becomes taper-like. When there are obtained some effects by the combined use of the onium salt compound and the sulfone compound and/or the sulfonate compound, there result other defects such as formation of scum upon development. In the case of using the sulfone compound and the sulfonate compound as a mixture, the mixing ratio (by weight) is preferably 1:0.5 to 1:10. Further, as to the total amount of the acid generators, they are used in an amount of preferably 1 to 10 parts by weight per 100 parts by weight of the organic materials having a substituent or substituents capable of being released in the presence of an acid.

Additionally, in the present invention, the phrase of "good acid-generating efficiency" means that a high sensitivity (usually 50 mJ/cm$^2$ or less) is obtained when a chemically amplified resist composition is prepared by using a particular acid-generating agent alone, whereas the phrase of "poor acid-generating efficiency" means that a low sensitivity (usually more than 50 mJ/cm$^2$) is obtained when a chemically amplified resist composition is prepared by using a particular acid-generating agent alone. As sulfone compounds and sulfonate compounds with good acid-generating efficiency, there are illustrated, for example, those which have a diazo group within the molecule such as bisphenylsulfonyldiazo-methane, etc. and, as sulfone compounds and sulfonate compounds with poor acid-generating efficiency, there are illustrated those which have no diazo group within the molecule such as biscyclohexylsulfonylmethane, bisphenylsulfonylmethane, etc.

According to the present invention, defects with the acid-generators can be removed, and a pattern image is obtained which having a strong development-inhibiting effect in unexposed areas and which having a high solubility for a developing agent in exposed areas by using the onium salt compound and the sulfone compound and/or the sulfonate compound in combination and in optimum amount, thus a highly resolved developed pattern with good profile being formed.

Basic Compound

As the basic compounds, any of both radiation responsive basic compounds capable of being decomposed by exposure to radiation and radiation non-responsive basic compounds may be used. Addition of the basic compound serves to suppress deterioration of pattern properties even when processing steps are conducted with various delayed intervals upon formation of the pattern and can prevent diffusion of the acid produced in exposed areas into unexposed areas to thereby prevent reduction of contrast, thus being preferred. The basic compound is added preferably in an amount of 0.05 to 10 parts by weight per 100 parts by weight of the organic materials containing a substituent or substituents capable of being released in the presence of an acid. As the radiation responsive basic compound, sulfonium compounds and iodonium compounds are used. As the sulfonium compounds, those which are represented by the following general formulae I to IV are preferred.

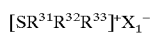
(I)

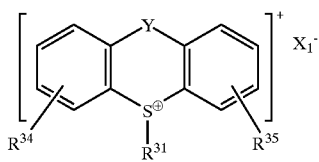
(II)

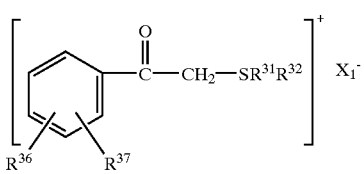
(III)

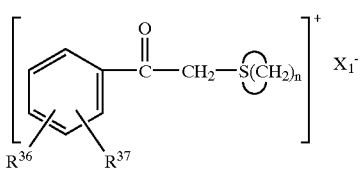
(IV)

Wherein $R^{31}$, $R^{32}$ and $R^{33}$ each represents a $C_1$–$C_{18}$ alkyl, aryl or heteroaryl group, or an aryl group mono-, di- or tri-substituted by alkyl, alkylaryl, halogen, alkoxyl, phenoxy, thiophenol, phenylsulfonyl or phenylsulfenyl, Y represents $(CH_2)_m$ (wherein m represents 0 or 1), O or S, $R^{34}$, $R^{35}$, $R^{36}$ and $R^{37}$ each represents a $C_1$–$C_4$ alkyl or alkoxyl group or a halogen atom, n represents 5 or 6 and $X_1$ represents a basic anion having a pK$_B$ value of −3 to +5.

Preferable sulfonium compounds represented by the above general formulae I–IV are those wherein $R^{31}$, $R^{32}$ and $R^{33}$ each represents methyl, ethyl, propyl, isopropyl, butyl, phenyl, biphenyl, tolyl, xylyl, chlorophenyl, bromophenyl, methoxyphenyl, ethoxyphenyl, propyloxyphenyl, butyloxyphenyl, t-butyloxyphenyl, phenoxyphenyl, thiophenoxyphenyl, phenoxyphenyl, thiophenoxyphenyl or phenylsulfonylphenyl, $R^{34}$, $R^{35}$, $R^{36}$ and $R^{37}$ each represents $C_1$–$C_4$ alkyl, methoxy, ethoxy, chlorine or bromine, and $X_1$ represents a hydroxyl group, OR (wherein R represents $C_1$–$C_4$ alkyl), OCOR' (wherein R' represents $C_1$–$C_4$ alkyl, aryl or alkylaryl), OCOO$^-$ or OSOO$^-$.

On the other hand, as the iodonium compounds, those which are represented by the following general formulae V–VII are preferred.

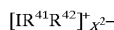
(V)

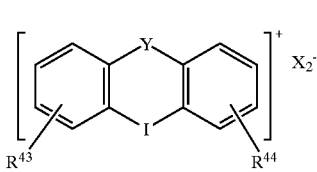
(VI)

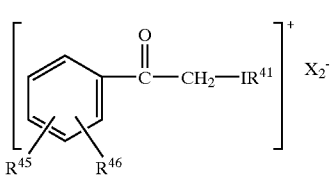
(VII)

Wherein $R^{41}$ and $R^{42}$ each represents a $C_1$–$C_{18}$ alkyl, aryl or heteroaryl group, or an aryl group mono-, di- or tri-substituted by alkyl, aryl, halogen, alkoxyl, phenoxy, thiophenol, phenylsulfonyl or phenylsulfenyl, Y represents $(CH_2)_m$ (wherein m represents 0 or 1), O or S, $R^{43}$, $R^{44}$, $R^{45}$ and $R^{46}$ each represents a $C_1$–$C_4$ alkyl or alkoxyl group or a halogen atom, n represents 5 or 6 and $X_2$ represents a basic anion having a pK$_B$ value of −3 to +5.

Preferable iodonium compounds represented by the above general formulae V–VII are those wherein $R^{41}$ and $R^{42}$ each represents methyl, ethyl, propyl, isopropyl, butyl, phenyl, biphenyl, tolyl, xylyl, chlorophenyl, bromophenyl, methoxyphenyl, ethoxyphenyl, propyloxyphenyl, butyloxyphenyl, t-butyloxyphenyl, phenoxyphenyl, thiophenoxyphenyl, phenoxyphenyl, thiophenoxyphenyl or phenylsulfonylphenyl, $R^{43}$, $R^{44}$, $R^{45}$ and $R^{46}$ each represents $C_1-C_4$ alkyl, methoxy, ethoxy, chlorine or bromine, and $X_2$ represents a hydroxyl group, OR (wherein R represents $C_1-C_4$ alkyl), OCOR' (wherein R' represents $C_1-C_4$ alkyl, aryl or alkylaryl), $OCOO^-$ or $OSOO^-$.

As particularly preferable examples of the above-described sulfonium compounds and iodonium compounds, there are illustrated, for example, triphenylsulfonium hydroxide, triphenylsulfonium acetate, triphenylsulfonium phenolate, tris-(4-methylphenyl)sulfonium hydroxide, tris-(4-methylphenyl)sulfonium acetate, tris-(4-methyl-phenyl) sulfonium phenolate, diphenyliodonium hydroxide, di-phenyliodonium acetate, diphenyliodonium phenolate, bis-(4-t-butylphenyl)iodonium hydroxide, bis-(4-t-butylphenyl)iodonium acetate, bis-(4-t-butylphenyl) iodonium phenolate, etc.

In addition, as the radiation insensitive basic compounds, there are used ammonium compounds. Preferred ammonium compounds are those quaternary ammonium salts represented by the following general formula VIII:

$$[NR^{51}R^{52}R^{53}R^{54}]^+X_3^- \quad \text{(VIII)}$$

wherein $R^{51}$, $R^{52}$, $R^{53}$ and $R^{54}$ each represents a $C_1-C_{18}$ alkyl group, a cycloalkyl group, an alkylaryl group or an aryl group in which one or more aliphatic $CH_2$ may be replaced by oxygen atom, and $X_3$ represents a basic anion having a $pK_B$ value of −3−+5.

As the compounds represented by the above general formula VIII, those wherein $R^{51}-R^{54}$ each represents methyl, ethyl, propyl, isopropyl, butyl, dodecyl, phenyl or benzyl, and $X_3$ represents a hydroxyl group, OR (wherein R represents $C_1-C_4$ alkyl), OCOR'' (wherein R'' represents $C_1-C_4$ alkyl or aryl), $OCOO^-$ or $OSOO^-$ are preferably used, with tetramethylammonium hydroxide and tetrabutylammonium hydroxide being particularly preferred.

In the present invention, other basic compounds may be added in addition to the above-described specific basic compounds. As such other basic compounds, there are illustrated, for example, (i) amines such as n-hexylamine, dodecylamine, aniline, dimethylaniline, diphenylamine, triphenylamine, diazabicyclooctane, diazabicycloundecane, etc., (ii) basic heterocyclic compounds such as 3-phenylpyridine, 4-phenylpyridine, lutidine, 2,6-di-t-butylpyridine, etc., and (iii) sulfonylhydrazides such as 4-methylbenzenesulfonyl-hydrazide, 4,4'-oxybis(benzenesulfonylhydrazide), 1,3-benzenesulfonylhydrazide, etc. These other basic compounds may be used alone or in combination of two or more.

In the present invention, the acid-generating agent and the basic compound are preferably of the same type. For example, when both compounds are sulfonium compounds or iodonium compounds, there are obtained good effects with respect to stability of sensitivity and the like in storage.

Other Additives

In addition to the above-described basic compounds, optional additives conventionally used in chemically amplified resist compositions may be added. For example, there are illustrated surfactants, sensitizers, light absorbents, dyes, pigments, organic carboxylic acids, leveling agents, stabilizers, low molecular weight compounds, plasticizers, etc.

Surfactants exhibit the effects of improving coating properties of the chemically amplified resist composition, preventing striation and improving developability. Preferably used surfactants include, for example, polyoxyethylene lauryl ether, polyoxyethylene stearyl ether, polyoxyethylene oleyl ether, polyoxyethylene octyl ether, polyoxyethylene nonylphenyl ether, polyoxyethylene glycol dilaurate, polyoxyethylene glycol distearate, and fluorine-containing derivatives thereof. These surfactants are used usually in an amount of 2 parts by weight or less per 100 parts by weight of resin components in a chemically amplified resist composition.

As the sensitizers, there are illustrated acetophenones, benzophenones, naphthalenes, biacetyl, Eosine, Rose Bengale, anthracenes, pyrenes, phenothiazines, etc.

Solvents

As solvents, any one may be used that can dissolve the components in the chemically amplified resist material to form a uniform radiation sensitive material coating. Specific examples of solvents include glycol ethers such as ethyleneglycol monomethyl ether, ethyleneglycol monoethyl ether, and propyleneglycol monomethyl ether; glycol ether acetates such as ethyleneglycol monoethyl ether acetate and propyleneglycol monomethyl ether acetate (PGMEA); esters such as ethyl lactate; and ketones such as acetone, methyl ethyl ketone, cyclopentanone, cyclohexanone and cycloheptanone. Additionally, aromatic hydrocarbons such as toluene and xylene may be used as necessary. Acetonitrile, dimethylformamide, dioxane, etc. may also be used as the case demands. These solvents may be used alone or in a form of a mixture of two or more. Total amount of the solid components in the chemically amplified resist composition is preferably 5 to 50% by weight, more preferably 10 to 25% by weight.

Formation of Resist Pattern

Formation of a resist pattern using the chemically amplified resist composition of the present invention is conducted as follows. Firstly, the chemically amplified resist composition of the present invention is applied to a substrate such as silicon wafer by a known method such as spin coating, cast coating, roller coating or the like, and the thus coated substrate was subjected to baking on a hot plate at 60–150° C., for example, for about 1 to 3 minutes to form a uniform resist coating having a thickness of, for example, 300–3000 nm. Then, this resist coating is exposed with radiation through or without a mask to project a desired pattern. As the radiation to be used for the exposure, deep UV rays, X rays, electron beams, etc. are properly used depending on the kind of the acid-generator used. In addition, radiation amount is selected so as to obtain optimal result depending upon the formulation of chemically amplified resist composition. For example, in the case of using deep UV rays, a KrF excimer laser of 248 nm in wavelength is used as an exposure equipment and the resist coating is exposed in an radiation amount of 1 to 100 mJ/cm². The exposed wafer is subjected, if necessary, to baking (PEB) at a temperature of, for example, 50–150° C., then developed according to a dipping method, a spraying method, a paddle-developing method or the like for about 1 to 3 minutes using an alkaline developer solution such as a 2.38 wt % aqueous solution of tetramethylammonium hydroxide. Thus, a desired positive resist pattern can be formed using the chemically amplified resist composition of the present invention.

Additionally, as the alkaline developer solution, an aqueous solution of tetramethylammonium hydroxide described above, which is metal ion-free, is usually used as a preferred developer solution. However, aqueous solutions of other alkaline compounds such as sodium hydroxide, potassium hydroxide, sodium carbonate, sodium silicate, sodium metasilicate, aqueous ammonia, ethylamine, n-propylamine, diethylamine, dimethylethanolamine, methyldiethylamine, di-methylethanolamine, triethanolamine, tetraethylammonium hydroxide, choline, pyrrole or piperidine may also be used. These alkaline compounds are dissolved in a concentration of usually 1 to 10 wt %, preferably 2 to 5 wt %, to use the resulting solution as a developer solution. The developer solution may further contain water-soluble organic solvents such as methanol or ethanol and surfactants as the case demands. After the developing step using the alkaline developer solution, the substrate is usually washed with water.
Best Mode for Practicing the Invention The present invention will be described more specifically by reference to Examples which, however, are not to be construed as limiting the present invention in any way.

EXAMPLE 1
Preparation of Photo-resist Composition

A resist solution was prepared by using 0.567 g of triphenylsulfonium trifurate, 3.0 g of biscyclohexylsulfonyl diazomethane, 7.9 g of a solution of 0.1 mmol/g of triphenylsulfonium acetate (TPSA) in propylene glycol monomethyl ether acetate (PGMEA) and 0.06 g of Megafac (surfactant made by Dainippon Ink and chemicals Corporation: ingredient for improving filming properties upon coating resist and for improving affinity for a substrate) per 100 g of poly[p-(1-ethoxyethoxy)styrene-co-p-hydroxystyrene] and adjusting the content of the solid components to 15.5 wt % using PGMEA.
Formation of Resist Image The above-described resist solution was spin-coated on a substrate for semiconductor and baked on a direct hot plate at 90° C. for 60 seconds to form a 0.690-$\mu$m thick resist coating. This resist coating was selectively exposed through a mask using 248.4 nm KrF excimer laser light, subjected to post exposure baking (PEB) on a direct hot plate at 110° C. for 90 seconds, then paddle-developed for 60 seconds in an alkaline developer solution (a 2.38 wt % aqueous solution of tetramethylammonium hydroxide (TMAH)) to obtain a positive, line-and-space pattern on the silicon wafer.

Observation of line width and cross sectional profile of the positive pattern under a scanning type electronic microscope revealed that it was a pattern of 0.18 $\mu$m or less with good pattern profile having no standing wave at an exposure amount of 24 mJ/cm$^2$.

COMPARATIVE EXAMPLE 1
Preparation of Photo-resist Composition

A resist solution was prepared by using 1.550 g of triphenylsulfoniumtrifurate, 18.0 g of a solution of 0.1 mmol/g of triphenylsulfonium acetate (TPSA) and 0.06 g of Megafac per 100 g of poly[p-(1-ethoxyethoxy) styrene-co-p-hydroxystyrene] and adjusting the content of the solid components to 15.5 wt % using PGMEA.

Observation of line width and cross sectional profile of the positive pattern was conducted under a scanning type electronic microscope in the same manner as in Example 1 to find that a pattern of 0.20 $\mu$m or less was formed at an exposure amount of 36 mJ/cm$^2$, but serious standing wave was observed.

EXAMPLE 2
Preparation of Photo-resist Composition

In the same manner as in Example 1 except for using 3.0 g of biscyclohexylsulfonyl methane in place of 3.0 g of biscyclohexylsulfonyl diazomethane, there was obtained a resist solution.

Observation of line width and cross sectional profile of the positive pattern was conducted under a scanning type electronic microscope in the same manner as in Example 1 to find that a pattern of 0.18 $\mu$m or less with good pattern profile having no standing wave was formed at an exposure amount of 38 mJ/cm$^2$. In this case, difference between line width in an isolated pattern area and that in a dense pattern area was 0.02 $\mu$m.

COMPARATIVE EXAMPLE 2
Preparation of Photo-resist Composition

A resist solution was prepared by using 5.0 g of biscyclohexylsulfonyl diazomethane, 4.0 g of a solution of 0.1 mmol/g of triphenylsulfonium acetate (TPSA) in PGMEA and 0.06 g of Megafac per 100 g of poly[p-(1-ethoxyethoxy) styrene-co-p-hydroxystyrene] and adjusting the content of the solid components to 15.5 wt % using PGMEA.

Observation of line width and cross sectional profile of the positive pattern was conducted under a scanning type electronic microscope in the same manner as in Example 1 to find that a pattern of 0.20 $\mu$m or less with good pattern profile having no standing wave was formed at an exposure amount of 18 mJ/cm$^2$, but difference between line width in an isolated pattern area and that in a dense pattern area was 0.09 $\mu$m.

EXAMPLE 3
Preparation of Photo-resist Composition

A resist solution was prepared by using 1.0 g of triphenylsulfonium trifurate, 3.0 g of biscyclohexylsulfonyl diazomethane, 3.0 g of biscyclohexylsulfonyl methane, 7.9 g of a solution of 0.1 mmol/g of triphenylsulfonium acetate (TPSA) in PGMEA and 0.06 g of Megafac per 100 g of poly[p-butoxycalbonyloxymethylstyrene-co-p-hydroxystyrene] and adjusting the content of the solid components to 15.5 wt % using PGMEA.

Observation of line width and cross sectional profile of the positive pattern was conducted under a scanning type electronic microscope in the same manner as in Example 1 to find that a pattern of 0.18 $\mu$m or less with good pattern profile having no standing wave was formed at an exposure amount of 30 mJ/cm$^2$.

EXAMPLE 4
Preparation of Photo-resist Composition

A resist solution was prepared by using 0.567 g of triphenylsulfonium trifurate, 1.0 g of biscyclohexylsulfonyl diazomethane, 0.5 g of pyrogallol tristrifurate, 7.9 g of a solution of 0.1 mmol/g of triphenylsulfonium acetate (TPSA) in PGMEA and 0.06 g of Megafac per 100 g of poly[p-(1-ethoxyethoxy)styrene-co-p-hydroxystyrene] and adjusting the content of the solid components to 15.5 wt % using PGMEA.

Observation of line width and cross sectional profile of the positive pattern was conducted under a scanning type electronic microscope in the same manner as in Example 1 to find that a pattern of 0.18 $\mu$m or less with good pattern profile having no standing wave was formed at an exposure amount of 20 mJ/cm$^2$.
Advantages of the Invention As has been described in detail hereinbefore, the chemically amplified resist composition of the present invention shows a high sensitivity, high resolution, excellent processing adaptability and excellent processing stability and can form a good resist pattern which is free of T-top profile, which shows no difference between line width in an isolated pattern area and that in a dense pattern area and which is free of standing wave.
Industrial Utility The chemically amplified resist composition of the present invention can be used as a radiation sensitive resist material for manufacturing integrated circuit elements or conducting fine processing.

What is claimed is:

1. A chemically amplified resist composition comprising an organic material having a substituent consisting of one species of acid labile group, and a compound capable of generating an acid upon exposure with radiation, wherein the compound capable of generating an acid upon exposure with radiation comprises at least one onium salt compound and at least one sulfone compound and/or sulfonate compound, further wherein the organic material is a reaction product of an alkaline soluble polymer and one compound which gives an acid decomposable group, where the alkali soluble polymer consists of a repeat unit of formula 1 or consists of a copolymer with repeat units of formula 1 and formula 2,

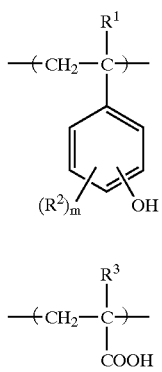

(1)

(2)

where,
R$^1$ represents hydrogen or alkyl,
R$^2$ represents alkyl,
R$^3$ represents hydrogen or alkyl, and
m is 0 or 1–4,
further where the sulfonate compound is at least one selected from among nitrobenzyl sulfonates, alkyl sulfonates, aryl sulfonates, benzoin sulfonates, sulfonic acid esters, pyrogallol tristriflate and benzoin tosylate, and further where the onium salt is selected from an iodonium salt, triphenyl sulfonium salt, (methylphenyl) diphenyl sulfonium salt, bis(methylphenyl) phenyl sulfonium salt, tris(methylphenyl) sulfonium salt, t-butylphenyl diphenyl sulfonium salt, tris(t-butylphenyl) sulfonium salt, methoxyphenyl sulfonium salt, mesityl diphenyl solonium salt, chloromethylphenyl diphenyl sulfonium salt, bis(chloromethylphenyl) phenyl sulfonium salt and tris(chloromethylphenyl) sulfonium salt.

2. The chemically amplified resist composition according to claim 1, wherein the composition further contains at least one of radiation sensitive basic compound selected from sulfonium compounds and iodonium compounds.

3. The chemically amplified resist composition according to claim 2, where the weight of the radiation sensitive basic compound is in the range 0.05–10 parts by weight per 100 parts by weight of the organic material protected by a substituent consisting of one species of acid labile group.

4. The chemically amplified resist composition according to claim 1, which contains 0.1–5 parts by weight of the onium salt compound and 0.5–10 parts by weight of sum of the sulfone compound and/or the sulfonate compound per 100 parts by weight of the organic material protected by a substituent or substituents capable of being released in the presence of an acid.

5. The chemically amplified resist composition according to claim 1, wherein the onium salt is at least one selected from among triphenylsulfonium triflate, triphenylsulfonium propionate, triphenylsulfonium hexaflate and diphenyliodonium triflate, the sulfone compound is at least one selected from among biscyclohexylsulfonyl diazomethane, bisphenylsulfonyl diazomethane, biscyclohexylsulfonyl methane and bisphenylsulfonyl methane.

* * * * *